US006803253B2

United States Patent
Tago et al.

(10) Patent No.: US 6,803,253 B2
(45) Date of Patent: Oct. 12, 2004

(54) METHOD FOR LAMINATING AND MOUNTING SEMICONDUCTOR CHIP

(75) Inventors: Masamoto Tago, Tokyo (JP); Yoshihiro Tomita, Tokyo (JP)

(73) Assignees: NEC Corporation, Tokyo (JP); Mitsubishi Denki Kabushiki Kaisha, Tokyo (JP)

( * ) Notice: Subject to any disclaimer, the term of this patent is extended or adjusted under 35 U.S.C. 154(b) by 51 days.

(21) Appl. No.: 10/000,020

(22) Filed: Dec. 4, 2001

(65) Prior Publication Data

US 2002/0106831 A1 Aug. 8, 2002

(30) Foreign Application Priority Data

Dec. 4, 2000 (JP) ........................................ 2000-368539

(51) Int. Cl.[7] .......................... H01L 21/44; H01L 21/48
(52) U.S. Cl. ...................... 438/108; 438/109; 438/612; 438/613; 438/618; 438/666; 438/667
(58) Field of Search ................................ 257/685–686, 257/723, 786, 737–738, 621, 772–774, 777–779, 680, 750; 438/107, 108, 109, 110, 612, 613, 614, 617, 618, 666, 667, 615, 616, 625, 15, 778; 228/180.22

(56) References Cited

U.S. PATENT DOCUMENTS 5,540,812 A * 7/1996 Kadomura
5,576,053 A * 11/1996 Senda et al.
5,889,326 A * 3/1999 Tanaka
6,010,060 A * 1/2000 Sarkhel et al.
6,555,414 B1 * 4/2003 Vanfleteren et al.
2002/0090756 A1 * 7/2002 Tago et al. ................. 438/108

FOREIGN PATENT DOCUMENTS

| JP | A 3-171643 | 7/1991 |
| JP | A 2002-110726 | 4/2002 |
| JP | 2002-110726 | * 12/2002 |
| WO | 97/11492 | 3/1997 |

* cited by examiner

Primary Examiner—Wael Fahmy
Assistant Examiner—DiLinh Nguyen
(74) Attorney, Agent, or Firm—Young & Thompson

(57) ABSTRACT

A plurality of semiconductor chips each having an electrode surface are sequentially laminated and mounted. Initially, the electrode surfaces of the semiconductor chips are activated. Then, the semiconductor chips are positioned. Successively, the semiconductor chips are laminated and bonded by pressing such that a reaction layer is not formed or formation of the reaction layer is suppressed excessively. Finally, the semiconductor chips are entirely heated so as to form the reaction layer after lamination and bonding of all the semiconductor chips are completed.

17 Claims, 4 Drawing Sheets

METHOD FOR LAMINATING AND MOUNTING SEMICONDUCTOR CHIP

BACKGROUND OF THE INVENTION

This invention broadly relates to a method for laminating and mounting a semiconductor chip. More specifically, this invention is directed to a method for laminating and mounting a semiconductor chip in a three-dimensional manner.

In a technique for laminating and mounting the semiconductor chip of the type described, when the semiconductor chips are directly laminated to each other, a semiconductor chip with a small size is equipped on a circuit surface of the other semiconductor chip with a large size via adhesives, and is sealed so as to obtain electrical connection by the use of the known wire-bonding.

High-density mounting is realized by laminating the semiconductor chips. Under this circumstance, it is becoming increasingly important to assemble the semiconductor chips without giving damages against the circuit surface in the cause of impact of the bonding.

To this end, it is necessary that the semiconductor chips to be laminated are sequentially reduced in sizes as a precondition for lamination. Consequently, the semiconductor chip must be thinly processed in order to achieve high density of a semiconductor device.

Referring to now FIG. 1, description will be made about a related method for laminating and mounting a semiconductor chip. In short, laminated semiconductor chips are connected to each other by the wire-bonding in a semiconductor device illustrated in FIG. 1.

More specifically, a semiconductor chip 1a and a semiconductor chip 1b with a size smaller than the semiconductor chip 1a are laminated by Ag paste 13 on an interposer 12.

Further, the semiconductor chips 1a and 1b are electrically connected by the use of wire-bonding wires 11, are sealed with mold resin 15, and then are attached with an external terminals (solder bumps 14), thus constituting the semiconductor device illustrated in FIG. 1.

However, thus-produced semiconductor device realizes the electrical connection via the wire-bonding. In consequence, only semiconductor chips having different sizes to each other can be laminated in this case. Moreover, the semiconductor chips can not be equipped by face-down.

Accordingly, an additional region for the wire-bonding is necessary, thus being insufficient for the mounting with the high-density.

In addition, a large load is inevitably applied to the circuit surface of the semiconductor chip laminated at a lower stage in the cause of the wire-bonding for performing the electrical connection between the semiconductor chip and the interposer after laminating the semiconductor chips. This may cause to destroy the semiconductor chip.

In the meantime, there is a method for laminating the semiconductor chips after assembling the semiconductor device suitable for the lamination without directly laminating the semiconductor chips as another related method for laminating and mounting the semiconductor chips.

Referring to FIGS. 2A and 2B, description will be made about such another related method for laminating and mounting the semiconductor chips.

A semiconductor chip 1 is arranged on an interposer 12, and a solder bump 14 is formed thereon. Here, the arranged semiconductor chip 1 and interposer 12 are thinly processed within the range of standoff of the solder bump 14 for lamination.

After these semiconductor devices 1 and 3 are laminated and equipped with a desired number, a reflow process is entirely carried out to connect electrodes. Herein, it should be noted that the reference numeral 16 represents flux.

However, use must be made at every semiconductor chips for laminating the interposer in such a method, thus being not capable of producing a thin semiconductor device.

Further, although entire reflow is carried out during the lamination, a self-alignment process is also possible. Specifically, the lamination becomes possible only when a relatively large solder bump for a pitch between 0.5 mm and 1 mm is used so as to eliminate or reduce variation of flatness or positioning accuracy.

Moreover, there is a method for laminating semiconductor chips with a fine pitch as another related method for mounting semiconductor devices.

Referring to FIGS. 3A through 3D, description will be made about such another related method for mounting the semiconductor devices.

As illustrated in FIG. 3A, semiconductor chips 1 each having a circuit surface 6 and a back surface 7 are positioned, and are bonded with solder 4. Then, a semiconductor chip 1 to be subsequently laminated is positioned to thereby to bond with the solder.

In such a condition, the entire reflow is not expected the effect of the self-alignment because of the fine pitch. Consequently, the solder bonding is inevitably carried out sequentially. Herein, it should be noted that the reference numeral 2 represents a penetration electrode, the reference numeral 3 represent a bump, and the reference numeral 5 represents a solder bonding layer.

According to such a method, it is becoming important to enhance positioning accuracy of the electrodes of the semiconductor device, to sufficiently examine composition of electrode material of the semiconductor chip, and to further reduce thermal hysteresis during laminating and mounting.

However, it is difficult to miniaturize the semiconductor device in the related lamination method. Further, it is also difficult to entirely bond by reflow after laminating the semiconductor chips with a desired number in case where the semiconductor chip with a fine electrode is mounted. Consequently, the semiconductor chips must be sequentially laminated, and must be bonded by solder.

In this event, heat, which is applied during bonding the solder several times until the final lamination, is loaded for the bonding portion which is laminated initially. Thereby, the structures of the bonding portions are different between the first stage and the final stage. Further, reliability is lowered by heating repeatedly.

Taking such circumstances into consideration, electrode specification of the interposer must be changed at every laminations and layers, resulting in high cost.

SUMMARY OF THE INVENTION

It is therefore an object of this invention to provide a method for laminating and mounting a semiconductor chip, which is capable of mounting the semiconductor chip by entire heating reflow after lamination in a method for laminating and mounting a semiconductor chip with a fine electrode.

It is another object of this invention to provide a method for laminating and mounting a semiconductor chip, which is capable of manufacturing the semiconductor chip with high uniformity and reliability at a bonding portion.

According to this invention, a plurality of semiconductor chips each having an electrode surface are sequentially laminated and mounted.

Initially, the electrode surfaces of the semiconductor chips, which are arranged in opposition to each other, are activated.

Then, the semiconductor chips are positioned.

Successively, the semiconductor chips are laminated and bonded by pressing such that a reaction layer is not formed or formation of the reaction layer is suppressed excessively.

Finally, the semiconductor chips are entirely heated so as to form the reaction layer after lamination and bonding of all the semiconductor chips are completed.

Under this circumstance, supersonic wave may be applied in addition to the pressing in the laminating and bonding step.

Further, a bump is formed on the semiconductor chip, and the electrode surface includes solder formed on the bump.

Alternatively, a bump is formed on the semiconductor chip, and the electrode surface includes solder containing an active component formed by electroless plating.

In this event, the reaction layer comprises a bonding layer made of solder. The reaction layer may be uniformly formed between the semiconductor chips.

The activating step is preferably carried out in order to remove an organic substance on the electrode surface.

Further, the pressing step is desirably carried out such that the bonding is performed via interatomic force by approaching the activated electrode surface to an interatomic distance.

The activating step may be carried out by an atomic beam of inactive gas excited by plasma.

Alternatively the activating step may be carried out by irradiating radical fluorine or by sputtering.

Instead, the activating step may be carried out by thermally processing in reduction gas.

Specifically, the method according to this invention does not adopt such a method that the semiconductor chips are heated for each one-stage lamination, and are sequentially bonded.

The method of this invention adopts such a method that the lamination is carried out without heating instead of the temporary connection due to adhesion such as flux in the multiple lamination mounting of the semiconductor chips. In this condition, the heating and the solder bonding are completed after all lamination steps are finished.

Thus, the lamination is performed by the bonding without the heating, and the bonding is completed by the entire reflow. Thereby, the reaction layers can be formed in the same structure between the first stage of bonding portion and the final stage of bonding portion.

To this end, the thermal load applied to the bonding portion and the semiconductor chip becomes uniform, thus obtaining equal bonding strength. Consequently, it can be avoided that the reliability of the bonding portion is different in dependency upon the reliability of keeping under the high temperature. Further, the semiconductor chip having the electrode with the fine pitch can be laminated with high accuracy.

More specifically, heating is not carried out during temporary bonding Thereby, the lamination can be performed without the reaction layer. Instead, the lamination may be carried out such that the formation of the reaction layer is suppressed excessively. As a result, the uniform reaction layer is formed for each lamination and layer by entirely heating during bonding, thus being stable in structure.

DESCRIPTION OF PREFERRED EMBODIMENTS

Referring to FIGS. 4A through 4D and FIG. 5, description will be hereinafter made about a production method according to an embodiment of this invention.

Figure 1:
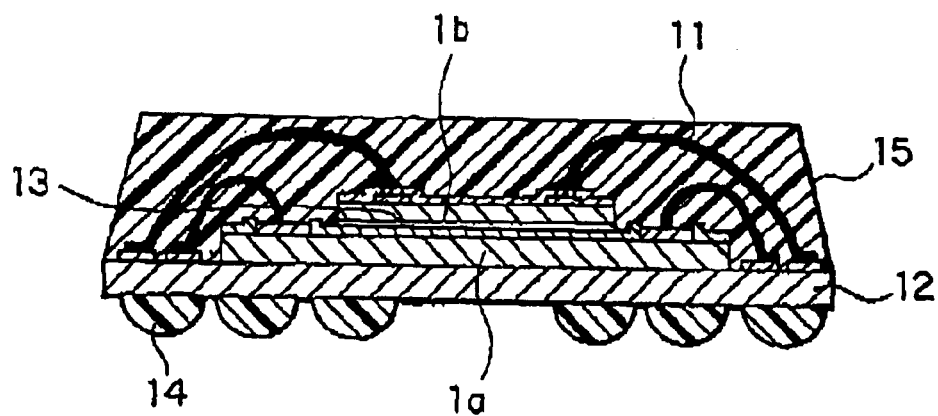
FIG. 1 is a cross sectional view showing a related technique for laminating and mounting semiconductor chips.
Figure 2A:
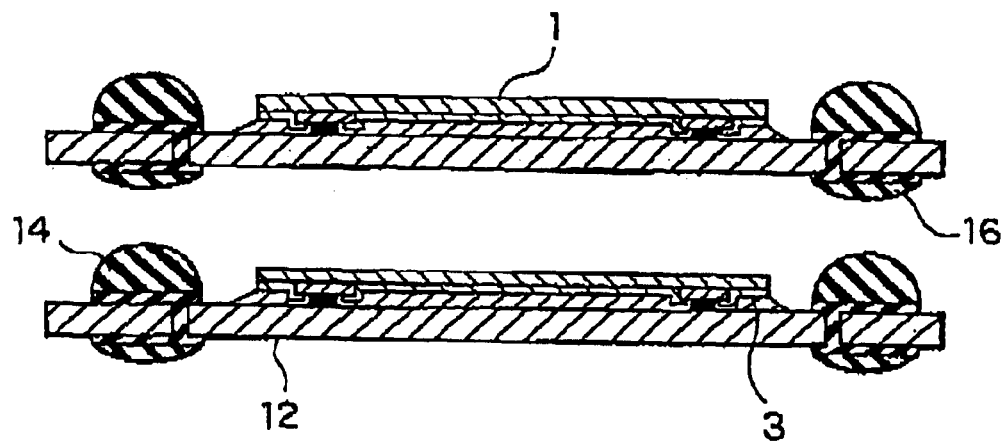
FIGS. 2A and 2B are cross sectional views showing another related technique for laminating and mounting semiconductor chips.
Figure 2B:
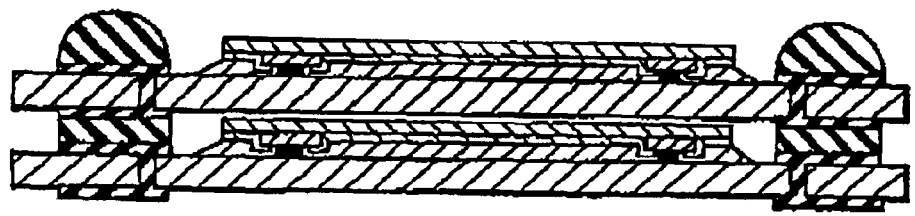
Figure 3A:
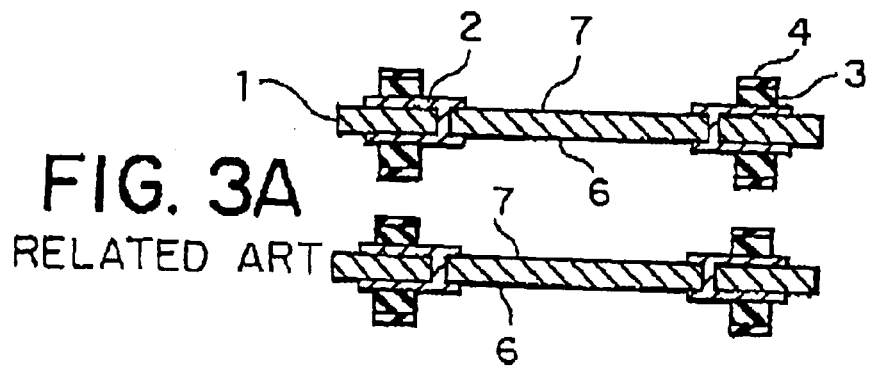
FIGS. 3A through 3D are cross sectional views showing still another related technique for laminating and mounting semiconductor chips.
Figure 3B:
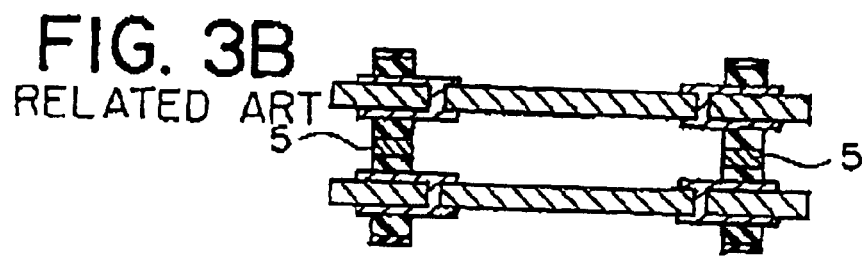
Figure 3C:
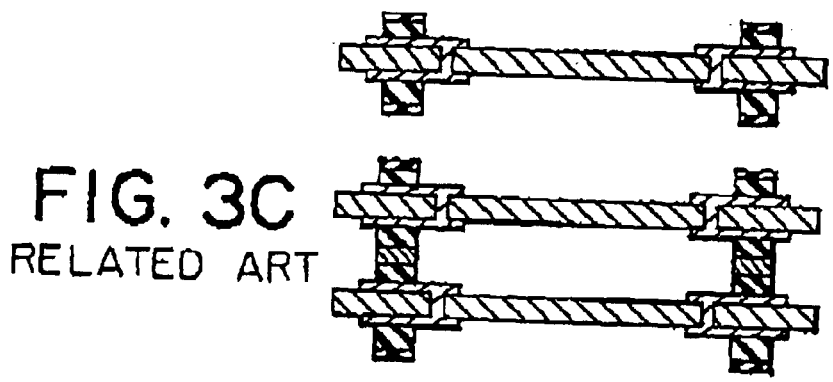
Figure 3D:
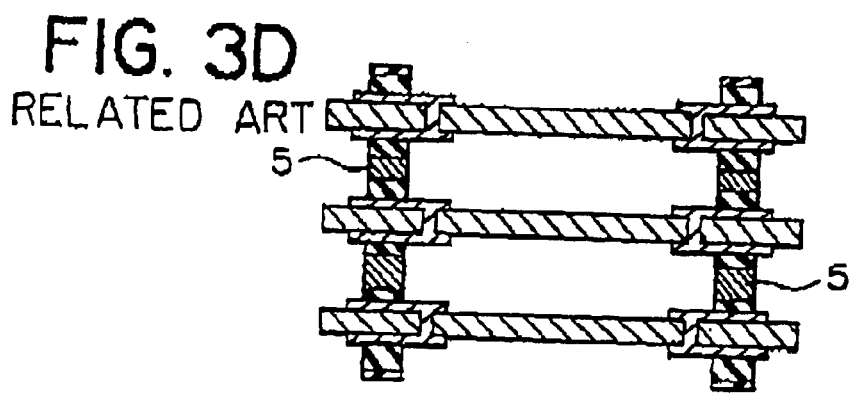
Figure 4A:
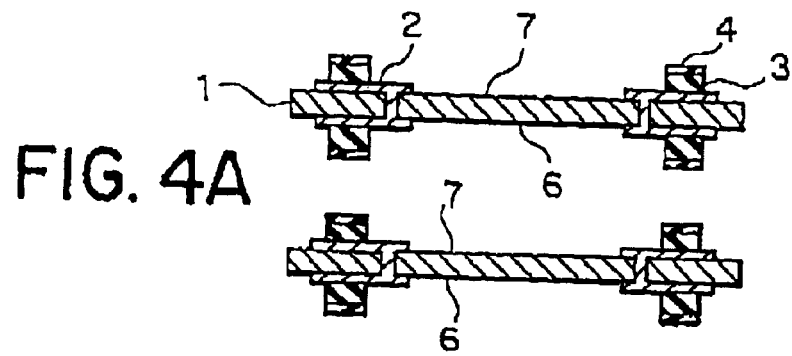
FIGS. 4A through 4D are cross sectional views showing a method for laminating and mounting semiconductor chips according to an embodiment of this invention.
Figure 4B:
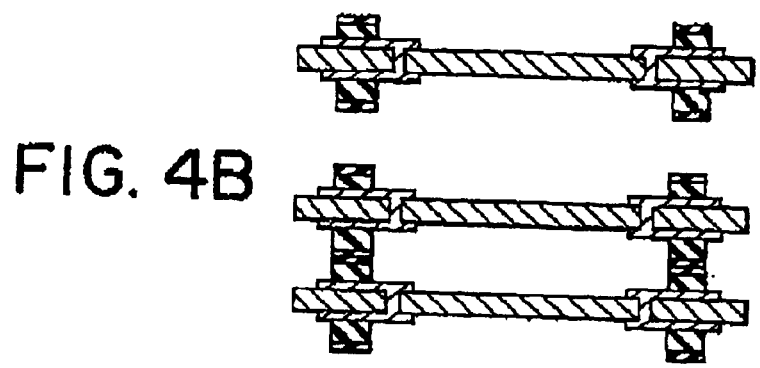
Figure 4C:
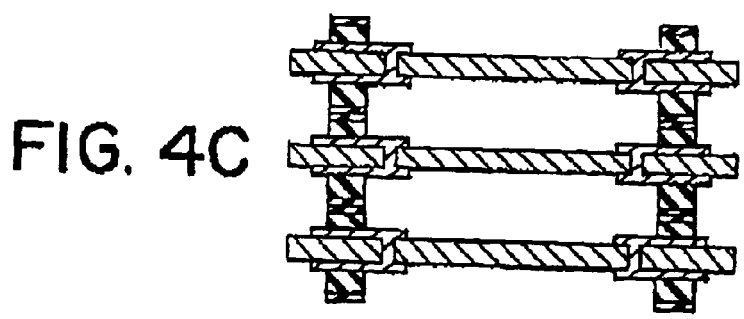
Figure 4D:
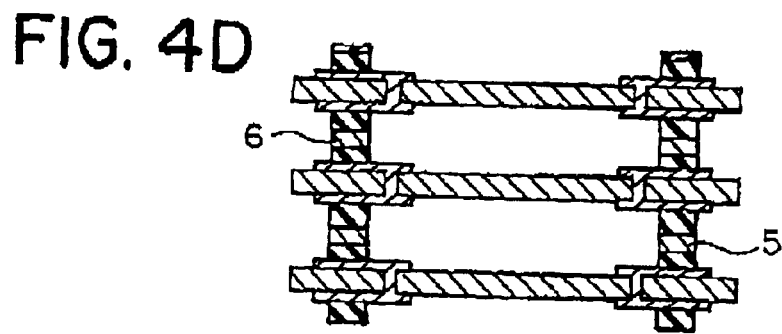
Figure 5:
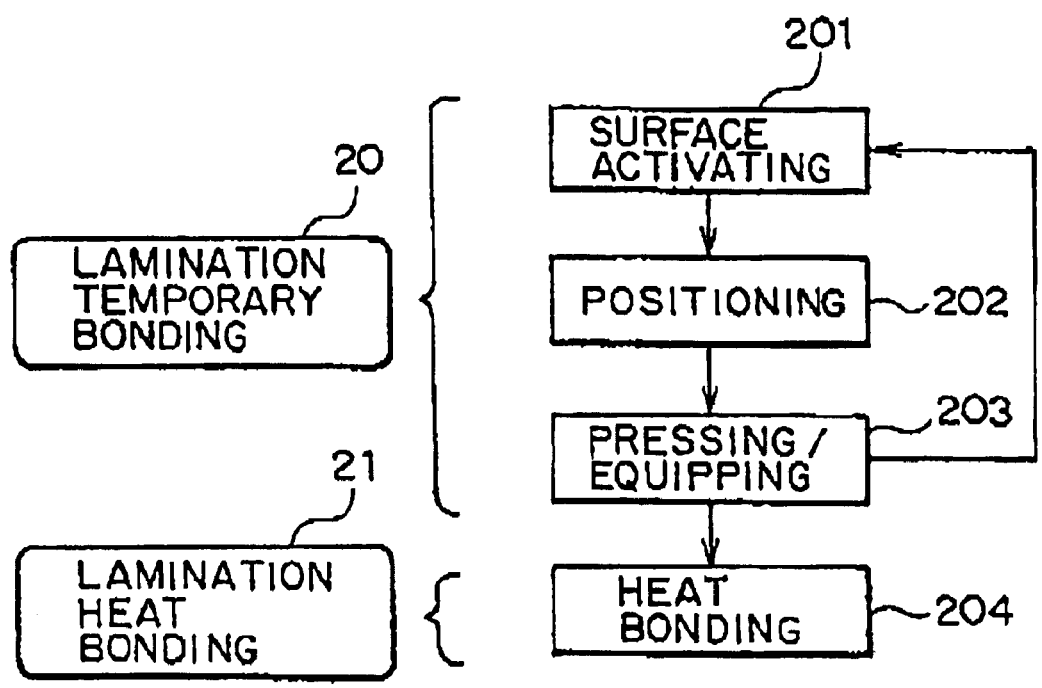
FIG. 5 is a flow chart showing a method for laminating and mounting semiconductor chips according to an embodiment of this invention.

In the flowchart illustrated in FIG. 5, a lamination process of a semiconductor chip is largely divided into a lamination temporary bonding step 20 and a lamination heating bonding step 21.

In this condition, the lamination temporary bonding step includes a surface activation step 201, a positioning step 202, and a pressing/equipping step 203. On the other hand, the lamination heating-bonding step comprises a heating bonding step 204.

As illustrated in FIG. 4, bumps 3 are formed on a circuit surface 6 and a back surface 7 of a semiconductor chip 1, and solder 4 is supplied on the bump 3. Herein, it should be noted that the reference numeral 2 indicates a penetration electrode.

For such a semiconductor chip 1, sputtering is carried out under reduction atmosphere, and alternatively, variety types of gases are introduced. Under this condition, an atomic beam excited by plasma is irradiated, so that organic substance on the surface of the solder 4 formed on the bump 3 is removed and activated (step 201).

The similar process is carried out for the semiconductor chip 1 to be laminated. Further, positioning is conducted in the reduction atmosphere such that the surface of the semiconductor chip 1 activated for the surface is not contaminated again as needed (step 202). Thereafter, pressing is carried out (step 203).

By pressing, the activated surface layer is close to an interatomic distance to thereby realize the bonding by interatomic force. Such bonding is carried out without heating. Thereby, a reaction layer (a solder bonding layer 5) is not formed. Alternatively, the formation of the reaction layer may be suppressed excessively. Through this step, the lamination can be performed by such temporary bonding that the reaction layer 5 is not formed.

After a desired number of semiconductor chips are laminated in the lamination temporary bonding step 20, the lamination mounting process is completed by heating up to such temperature to be bonded by solder (step 204).

By adopting this method, a washing step after bonding becomes unnecessary because the temporary attachment due to the adhesion of the flux is not carried out.

Further, heating is entirely performed after laminating a desired number of semiconductor chips without heating and bonding during lamination. Thereby, the bonding portion with high reliability having a uniform reaction layer is advantageously formed for each lamination and layer. Thereafter, the semiconductor chip is sealed with resin as needed, and is attached with the external terminal.

In the aforementioned embodiment, the surface activation step and the lamination temporary bonding step may not be carried out in the reduction atmosphere.

Alternatively, the surface activation may be performed by irradiating an atomic beam of inactive gas excited by plasma or radical fluorine or the other activated gas excited by plasma or the other gases. Instead, it may be performed by the sputtering method or by a thermal process in the reduction gas.

Further, the lamination temporary bonding may be carried out in the reduction atmosphere in the air on the condition that the surface activation is kept, or under inactivation atmosphere.

Moreover, the lamination temporary bonding due to pressing after the surface activation may be carried out by applying supersonic wave in addition to pressing.

In this case, although the solder 4 is supplied onto the bump 3, the solder may be supplied by the use of the electroless plating, and the solder containing component for activating the surface therein may be used.

The surface is activated by a reduction operation of phosphorous contained in the electroless plating, thus substituting or aiding the surface activation step. Herein, active component contained in the solder may be not phosphorous.

Further, the solder 4 may not be supplied onto the bump 3. Copper, gold, aluminum, and a variety of combinations of metal materials serving as the bump can be used by adjusting the method for the activating the surface and the reduction environment of atmosphere for the lamination according to the lamination method of this invention.

EXAMPLE

First Example

Referring to FIG. 4, description will be made about a first example of this invention.

The bumps 3 on the circuit surface 6 and the back surface 7 are formed by copper, and tin is supplied on the bumps 3 made of copper with 0.2~0.5 µm as the solder 4.

The semiconductor chips 1 to be laminated are activated with the surface, and are positioned to each other. Then, they are arranged in an apparatus with function for pressing and equipping, and are exposed in a vacuum state of about 1×10E-3~1×10E-5 pa. Thereafter, argon gas is introduced therein so as to generate plasma, and argon atoms are irradiated towards the surface of the bump for 5 minutes.

In this event, irradiation time depends upon an etching rate of material supplied as the bump or the solder, and is selected within the range between 1 minute and 20 minutes. Thereafter, the semiconductor chips are positioned to each other in such reduction atmosphere, and then are pressed so as to plastically deform such that the bonding surfaces of the bumps are joined to each other.

The temporary bonding is completed for the bump with the activated bonding surface via the aforementioned process. Thus, the lamination body, which is formed by temporally bonding sequentially, is heated up to 200° C., and the final bonding is completed by diffusing tin.

In the first example, the argon atomic beam is used in vacuum to activate the surface. Alternatively, gas excited by plasma in the air may be used. Further, although the pressing and temporary bonding after the surface activation is carried out in the air, it may be performed in the air introduced with gas such as nitrogen and argon,

Second Example

Referring to FIG. 4, description will be made about a second example of this invention.

The bumps 3 on the circuit surface 6 is formed by gold while the bump 3 on the back surface 7 is formed by copper.

The semiconductor chips 1 to be laminated are activated with the surface, and are positioned to each other. Then, they are arranged in an apparatus with function for pressing and equipping, and are exposed in a vacuum state of about 1×10E-3~1×10E-5 pa. Thereafter, argon gas is introduced therein so as to generate plasma, and argon atoms are irradiated towards the surface of the bump for 10 minutes.

Thereafter, the semiconductor chips are positioned to each other in such reduction atmosphere, and then are pressed so as to plastically deform such that the bonding surfaces of the bumps are joined to each other.

The temporary bonding is completed for the bump with the activated bonding surface via the aforementioned process. Thus, the lamination body, which is formed by temporally bonding sequentially, is heated up to 250° C., and the final bonding is completed by alternately diffusing gold and copper.

In this case, although the heating temperature is set to 250° C., the heating may be carried out under higher temperature such that the semiconductor chip does not become defective. Moreover, the material of the bump may be changes suitably, and the metal material can be combined freely.

While this invention has thus far been disclosed in conjunction with several embodiments thereof, it will be readily possible for those skilled in the art to put this invention into practice in various other manners.

What is claimed is:

1. A method for sequentially laminating and mounting a plurality of semiconductor chips each having an electrode surface, comprising the steps of:

activating the electrode surfaces of the semiconductor chips which are arranged in opposition to each other;

positioning the semiconductor chips;

laminating and bonding the semiconductor chips by pressing such that a reaction layer is not formed or formation of the reaction layer is suppressed;

entirely heating the semiconductor chips so as to form the reaction layer after lamination and bonding of all the semiconductor chips are completed;

wherein the reaction layer is uniformly formed between the semiconductor chips; and wherein the pressing step is carried out such that the bonding is performed via interatomic force by approaching the activated electrode surface to an interatomic distance.

2. A method as claimed in claim 1, wherein:

supersonic wave is applied in addition to the pressing in the laminating and bonding step.

3. A method as claimed in claim 1, wherein:

a bump is formed on the semiconductor chip, and the electrode surface includes solder formed on the bump.

4. A method as claimed in claim 1, wherein:

a bump is formed on the semiconductor chip, and the electrode surface includes solder containing an active component formed by electroless plating.

5. A method as claimed in claim 1, wherein:

the reaction layer comprises a bonding layer made of solder.

6. A method as claimed in claim 1, wherein:

the activating step is carried out in order to remove an organic substance on the electrode surface.

7. A method as claimed in claim 1, wherein:
the activating step is carried out by an atomic beam of inactive gas excited by plasma.

8. A method as claimed in claim 1, wherein:
the activating step is carried out by irradiating radical fluorine.

9. A method as claimed in claim 1, wherein:
the activating step is carried out by sputtering.

10. A method as claimed in claim 1, wherein:
the activating step is carried out by thermally processing in reduction gas.

11. The method as claimed in claim 1, wherein the electrode surface of each of said plural semiconductor chips is vertically aligned with one another.

12. A method of mounting plural substantially identical semiconductor chips, comprising the step of:

placing solder on each opposing bump of adjacent semiconductor chips;

activating a surface of the solder;

directly contacting at least two opposing bumps of said adjacent semiconductor chips with each other;

pressing said adjacent semiconductor chips together to bond them without heating;

then heating said plural semiconductor chips after all of the plural semiconductor chips to be heated have been pressed together;

a reaction layer is uniformly formed between the semiconductor chips; and wherein the pressing step is carried out such that the bonding is performed via interatomic force by approaching the activated surface of the solder to an interatomic distance.

13. The method as claimed in claim 12, wherein said activating step comprises irradiating an atomic beam excited by plasma.

14. The method as claimed in claim 12, wherein said activating step and said pressing step are performed in a reduction atmosphere.

15. The method as claimed in claim 12, wherein said placing solder step comprises electroless plating said bumps.

16. A method of mounting plural substantially identical semiconductor chips, comprising the steps of:

activating a surface of plural metal bumps on said semiconductor chips;

directly contacting at least two opposing bumps of said adjacent semiconductor chips to be each other;

pressing said adjacent semiconductor chips together to bond them without heating;

then heating said plural semiconductor chips after all of the plural semiconductor chips to be heated have been pressed together;

a reaction layer is uniformly formed between the semiconductor chips; and wherein the pressing step is carried out such that the bonding is performed via interatomic force by approaching the activated surface of the plural metal bumps to an interatomic distance.

17. The method as claimed in claim 16, wherein the plural metal bumps are one of copper, gold and aluminum.

\* \* \* \* \*